(12) United States Patent
Kuan et al.

(10) Patent No.: US 8,124,455 B2
(45) Date of Patent: Feb. 28, 2012

(54) WAFER STRENGTH REINFORCEMENT SYSTEM FOR ULTRA THIN WAFER THINNING

(75) Inventors: Heap Hoe Kuan, Singapore (SG); Byung Tai Do, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 301 days.

(21) Appl. No.: 11/306,098

(22) Filed: Dec. 15, 2005

(65) Prior Publication Data
US 2006/0219351 A1 Oct. 5, 2006

Related U.S. Application Data

(60) Provisional application No. 60/667,846, filed on Apr. 2, 2005, provisional application No. 60/668,816, filed on Apr. 5, 2005.

(51) Int. Cl.
*B32B 37/00* (2006.01)
*B32B 38/10* (2006.01)
*B29C 65/00* (2006.01)
*H01L 21/30* (2006.01)
*H01L 21/46* (2006.01)

(52) U.S. Cl. . 438/113; 257/618; 257/619; 257/E21.599; 438/114; 438/464; 438/465

(58) Field of Classification Search ............... 257/618, 257/619, E21.599; 438/113, 114, 464, 465
See application file for complete search history.

(56) References Cited

U.S. PATENT DOCUMENTS

| | | | |
|---|---|---|---|
| 3,562,965 A * | 2/1971 | Lange | 451/41 |
| 5,268,065 A | 12/1993 | Grupen-Shemansky | 156/630 |
| 6,656,819 B1 * | 12/2003 | Sugino et al. | 438/460 |
| 6,777,313 B2 | 8/2004 | Takyu et al. | 438/464 |
| 6,869,894 B2 | 3/2005 | Moore | 438/782 |
| 6,881,611 B1 * | 4/2005 | Fukasawa et al. | 438/114 |
| 7,172,950 B2 * | 2/2007 | Takezoe et al. | 438/460 |
| 2002/0020340 A1 * | 2/2002 | Dietze et al. | 117/30 |
| 2002/0134503 A1 * | 9/2002 | Hussinger et al. | 156/331.4 |
| 2003/0113984 A1 | 6/2003 | Okada et al. | 438/459 |
| 2003/0139049 A1 * | 7/2003 | Nakamura et al. | 438/692 |
| 2004/0097054 A1 * | 5/2004 | Abe | 438/460 |
| 2005/0006767 A1 | 1/2005 | Kumamoto | 257/738 |
| 2005/0064681 A1 * | 3/2005 | Wood et al. | 438/459 |
| 2005/0233547 A1 * | 10/2005 | Noda et al. | 438/459 |
| 2006/0008650 A1 * | 1/2006 | Wesselmann et al. | 428/411.1 |
| 2006/0046433 A1 * | 3/2006 | Sterrett et al. | 438/459 |

FOREIGN PATENT DOCUMENTS
JP 2004349649 A * 12/2004

OTHER PUBLICATIONS
Machine Translation of JP 2004-0349649, Dec. 9, 2004.*

* cited by examiner

*Primary Examiner* — Eugene Lee
*Assistant Examiner* — Peniel M Gumedzoe
(74) *Attorney, Agent, or Firm* — Mikio Ishimaru

(57) ABSTRACT

A wafer strength reinforcement system is provided including providing a wafer, providing a tape for supporting the wafer, and positioning a wafer edge support material for location between the tape and the wafer.

20 Claims, 4 Drawing Sheets

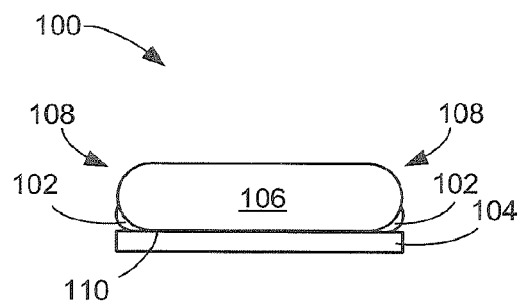
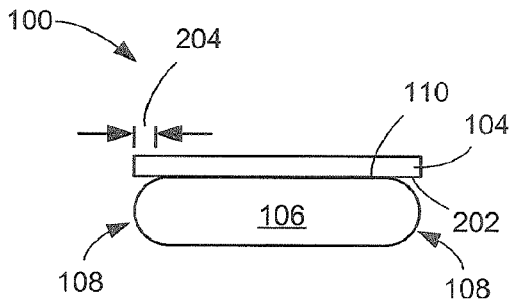
FIG. 1    FIG. 2
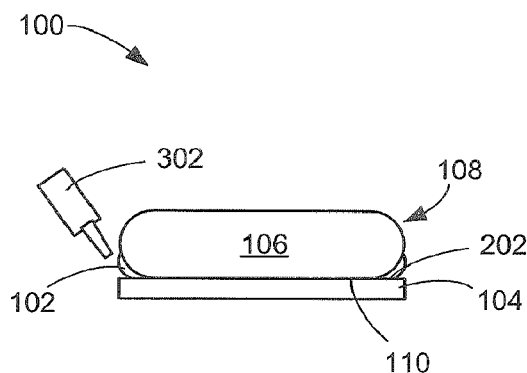
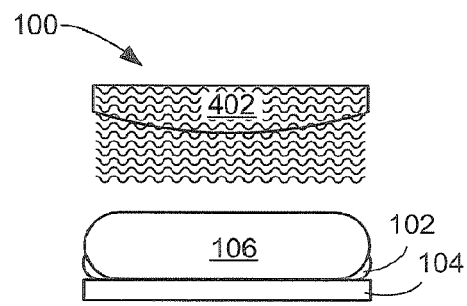
FIG. 3    FIG. 4
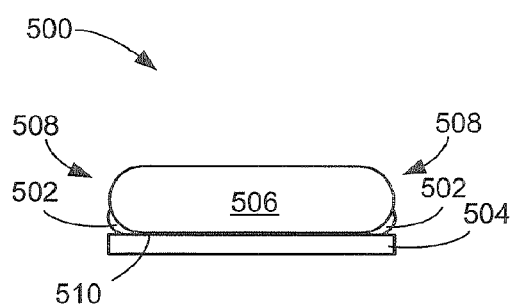
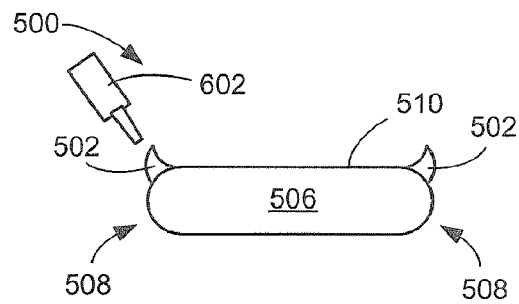
FIG. 5    FIG. 6

WAFER STRENGTH REINFORCEMENT SYSTEM FOR ULTRA THIN WAFER THINNING

CROSS-REFERENCE TO RELATED APPLICATION(S)

This application claims the benefit of U.S. Provisional Patent Application Ser. No. 60/667,846 filed Apr. 2, 2005, and U.S. Provisional Patent Application Ser. No. 60/668,816 filed Apr. 5, 2005, and the subject matter thereof is hereby incorporated herein by reference thereto.

TECHNICAL FIELD

The present invention relates generally to ultra thin wafer thinning, and more particularly to a system for wafer strength reinforcement for ultra thin wafer thinning.

BACKGROUND ART

Integrated circuits are used in many portable electronic products, such as cell phones, portable computers, voice recorders, etc. as well as in many larger electronic systems, such as cars, planes, industrial control systems, etc. Across virtually all applications, there continues to be demand for reducing the size and increasing performance of the devices. The intense demand is no more visible than in portable electronics that have become so ubiquitous.

As the demand for smaller electronic devices grows, manufacturers are seeking ways to reduce the size and weight of the packaged integrated circuits. To meet these needs, packaging technologies are shifting towards thinner profiles with more die stacking and/or wafer level packaging in bare die form. This drives the demand for better wafer thinning technology to achieve a very thin wafer thickness.

Existing technology has attempted to significantly reduce wafer stress during wafer thinning processes so that higher wafer production can be achieved. In addition to reducing wafer stress, some attempts also address wafer strength during processing hoping to avoid the effects of wafer stress. Technologies such as Dicing Before Backgrind (DBG), Etching (Dry or Wet), Plasma, Polishing (Dry or Wet) are some of the attempts adopted by various companies and industries to obtain an ultra thin wafer thickness.

However, these technologies can only reduce wafer stress within the wafer itself. The extreme edge of the original wafer (i.e. before grind) is rounded. When the wafer is ground ultra thin, this edge will be reduced to an extremely sharp edge, which is extremely weak. At a micro-level view, it can be observed that there is not any form of "support" at this part of the wafer. Hence, any application of uneven force during grinding or stress relieving can easily create a crack. This crack can continue to spread during further handling and cause wafer edge chipping or even wafer cracking. Because of the failure mechanism described, the existing wafer thinning technology will not able to provide a solution to prevent failures from occurring at the edge of the wafer.

Thus a need still remains for a wafer strength reinforcement system for ultra thin wafer thinning to provide thinner wafer profiles while reducing wafer stress and improving wafer strength, particularly at the edge of the wafer. In view of the increasing demand for improved density of integrated circuits and particularly portable electronic products, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a wafer strength reinforcement system including providing a wafer, providing a tape for supporting the wafer, and positioning a wafer edge support material for location between the tape and the wafer.

Certain embodiments of the invention have other aspects in addition to or in place of those mentioned or obvious from the above. The aspects will become apparent to those skilled in the art from a reading of the following detailed description when taken with reference to the accompanying drawings.

BRIEF DESCRIPTION OF THE DRAWINGS

FIG. 1 is a cross-sectional view of a wafer strength reinforcement system 100 in an embodiment of the present invention;

FIG. 2 is a cross-sectional view of the wafer strength reinforcement system 100 in a taping phase;

FIG. 3 is a cross-sectional view of the wafer strength reinforcement system 100 in a dispensing phase;

FIG. 4 is a cross-sectional view of the wafer strength reinforcement system 100 in a curing phase;

FIG. 5 is a cross-sectional view of a wafer strength reinforcement system in an alternative embodiment of the present invention;

FIG. 6 is a cross-sectional view of the wafer strength reinforcement system in a dispensing phase;

BEST MODE FOR CARRYING OUT THE INVENTION

Figure 7:
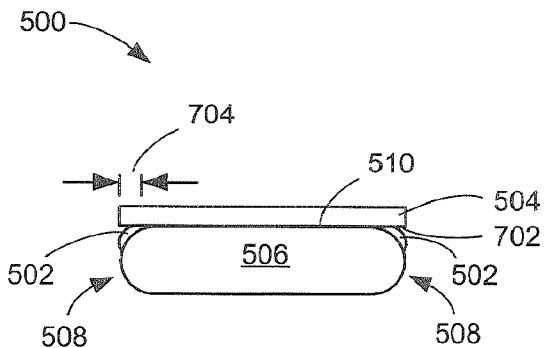
FIG. 7 is a cross-sectional view of the wafer strength reinforcement system in a taping phase.

In the following description, numerous specific details are given to provide a thorough understanding of the invention. However, it will be apparent that the invention may be practiced without these specific details. In order to avoid obscuring the present invention, some well-known circuits, and process steps are not disclosed in detail.

Likewise, the drawings showing embodiments of the apparatus/device are semi-diagrammatic and not to scale and, particularly, some of the dimensions are for the clarity of presentation and are shown greatly exaggerated in the drawing FIGS. Similarly, although the sectional views in the drawings for ease of description show the invention with surfaces as oriented downward, this arrangement in the FIGS. is arbitrary and is not intended to suggest that invention should necessarily be in a downward direction. Generally, the device can be operated in any orientation. The same numbers are used in all the drawing FIGS. to relate to the same elements.

The term "horizontal" as used herein is defined as a plane parallel to the conventional plane or surface of the wafer, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "processing" as used herein includes deposition of material or photoresist, patterning, exposure, development, etching, cleaning, and/or removal of the material or photoresist as required in forming a described structure.

Referring now to FIG. 1, therein is shown a cross-sectional view of a wafer strength reinforcement system 100 in an embodiment of the present invention. The wafer strength reinforcement system 100 provides a wafer edge reinforcement after a taping process and includes a wafer edge support material, such as a paste 102, which may be a liquid or semi-viscous paste, and a tape 104, such as a protective or a backgrinding tape. The paste 102 and the tape 104 are applied to a wafer 106, such as a semiconductor wafer. The paste 102 conforms to an edge 108 of the wafer 106 to support and protect the edge 108 of the wafer 106. The edge 108 has a rounded shape providing a non-horizontal edge with respect to a plane of the wafer 106. The tape 104 protects an active surface 110 of the wafer 106 during further processing. The tape 104 has sufficient strength to support the wafer 106 during a process such as backgrinding. The tape 104 can have a planar surface extending beyond the edge 108 of the wafer 106. The paste 102 and the tape 104 of the wafer strength reinforcement system 100 provide protection for both the edge 108 as well as the active surface 110.

Referring now to FIG. 2, therein is shown a cross-sectional view of the wafer strength reinforcement system 100 in a taping phase. The tape 104 adheres to and protects active circuitry (not shown) on the active surface 110 of the wafer 106. The tape 104 includes a contact surface 202 whereon the tape 104 may adhere to the wafer 106 without contaminating or damaging the active surface 110 of the wafer 106 during application or removal. An extension 204 of the tape 104 provides a region beyond a planar region of the active surface 110 for the paste 102. The tape 104 further provides high temperature resistance for curing and structural integrity for further processing.

Referring now to FIG. 3, therein is shown a cross-sectional view of the wafer strength reinforcement system 100 in a dispensing phase. The paste 102 is dispensed through a dispensing apparatus 302 to a region between the edge 108 of the wafer 106 and the extension 204 of the tape 104. The paste 102 conforms to a narrow region between the edge 108 of the wafer 106 and the extension 204 of the tape 104 through capillary action. Capillary action draws the paste 102 into regions not directly accessible to the dispensing apparatus 302. Capillary action is possible with the paste 102 having properties, such as liquid state, adhesion, cohesion and surface tension, and solid surfaces of the edge 108 and the extension 204.

Referring now to FIG. 4, therein is shown a cross-sectional view of the wafer strength reinforcement system 100 in a curing phase. The curing phase is optional with the paste 102 being used. Other types of hardening processes may be used. A curing apparatus 402 applies a process, such as heat, UV or laser irradiation, to the wafer strength reinforcement system 100 attached to the wafer 106. The curing process cures and hardens the paste 102. The paste 102 provides a hardness to withstand a thinning process, such as grinding, and a softness to cushion the wafer 106 during the thinning process. Further, the paste 102 provides an adhesive force equal to or greater than a thinning force exerted on the wafer 106 during the thinning process. The paste 102 may be removed with the tape 104 or remain on the wafer 106 after the tape 104 is removed.

Referring now to FIG. 5, therein is shown a cross-sectional view of a wafer strength reinforcement system 500 in an alternative embodiment of the present invention. The wafer strength reinforcement system 500 provides a wafer edge dispensing before taping process and includes a paste 502, such as a liquid paste, and a tape 504, such as a protective tape. The paste 502 and the tape 504 are applied to a wafer 506. The paste 502 conforms to an edge 508 of the wafer 506 to support and protect the edge 508 of the wafer 506. The tape 504 protects an active surface 510 of the wafer 506 during further processing. The paste 502 and the tape 504 of the wafer strength reinforcement system 500 provide protection for both the edge 508 as well as the active surface 510.

Referring now to FIG. 6, therein is shown a cross-sectional view of the wafer strength reinforcement system 500 in a dispensing phase. The paste 502 is positioned by being dispensed through a dispensing apparatus 602 to the edge 508 on the active surface 510 of the wafer 506. The paste 502 conforms to the edge 508 on the active surface 510 of the wafer 506 and may protrude above a planar surface of the active surface 510. Further, the paste 502 may extend onto the active surface 510 of the wafer 506. The dispensing apparatus 602 may provide a predetermined quantity of the paste 502 conforming to a narrow region between the edge 508 of the wafer 506 and the tape 504 of FIG. 5 (not shown).

Referring now to FIG. 7, therein is shown a cross-sectional view of the wafer strength reinforcement system 500 in a taping phase. The tape 504 adheres to and protects active circuitry (not shown) on the active surface 510 of the wafer 506. The tape 504 includes a contact surface 702 whereon the tape 504 may adhere to the wafer 506 without contaminating or damaging the active surface 510 of the wafer 506 during application or removal. An extension 704 of the tape 504 provides a region beyond a planar region of the active surface 510 for the paste 502. Applying the tape 504 redistributes the paste 502 to conform to the region between the edge 508 and the extension 704. The tape 504 further provides high temperature resistance for curing and structural integrity for further processing.

Figure 8:
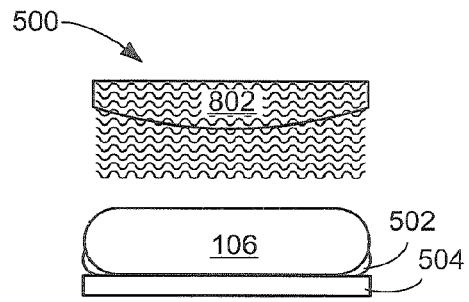
FIG. 8 is a cross-sectional view of the wafer strength reinforcement system in a curing phase.

Referring now to FIG. 8, therein is shown a cross-sectional view of the wafer strength reinforcement system 500 in a curing phase. A curing apparatus 802 applies a process, such as heat, UV or laser irradiation, to the wafer strength reinforcement system 500 attached to the wafer 506. The curing process cures and hardens the paste 502. The paste 502 provides a hardness to withstand a thinning process, such as grinding, and a softness to cushion the wafer 506 during the thinning process. Further, the paste 502 provides an adhesive force equal to or greater than a thinning force exerted on the wafer 506 during the thinning process. The paste 502 may be removed with the tape 504 or remain on the wafer 506 after the tape 504 is removed.

Figure 9:
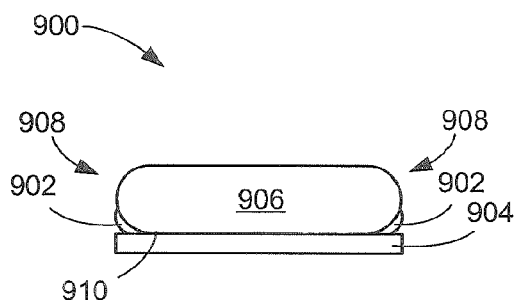
FIG. 9 is a cross-sectional view of a wafer strength reinforcement system in another alternative embodiment of the present invention.

Referring now to FIG. 9, therein is shown a cross-sectional view of a wafer strength reinforcement system 900 in another alternative embodiment of the present invention. The wafer strength reinforcement system 900 provides a tape edge dispensing before taping process and includes a paste 902, such as a liquid paste, and a tape 904, such as a protective tape. The paste 902 and the tape 904 are applied to a wafer 906. The paste 902 conforms to an edge 908 of the wafer 906 to support and protect the edge 908 of the wafer 906. The tape 904 protects an active surface 910 of the wafer 906 during further processing. The paste 902 and the tape 904 of the wafer strength reinforcement system 900 provide protection for both the edge 908 as well as the active surface 910.

Figure 10:
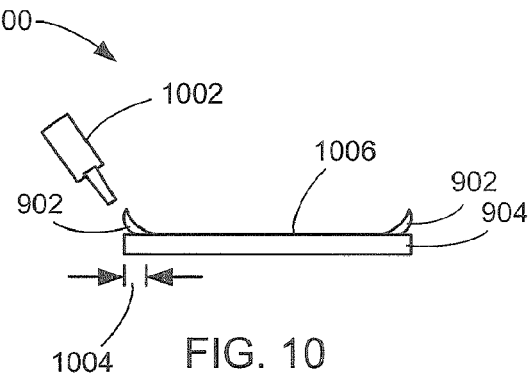
FIG. 10 is a cross-sectional view of the wafer strength reinforcement system in a dispensing phase.

Referring now to FIG. 10, therein is shown a cross-sectional view of the wafer strength reinforcement system 900 in a dispensing phase. The paste 902 is dispensed through a dispensing apparatus 1002 on an extension 1004 of a contact surface 1006 of the tape 904. The extension 1004 of the tape 904 provides a region beyond a planar region of the active surface 910 for the paste 902. The paste 902 conforms to the extension 1004 of the contact surface 1006 of the tape 904 and may protrude above a planar surface of the contact surface 1006. Further, the paste 902 may extend onto the contact surface 1006 of the tape 904. The dispensing apparatus 1002 may provide a predetermined quantity of the paste 902 conforming to a narrow region between the tape 904 and the edge 908 of FIG. 9 (not shown).

Figure 11:
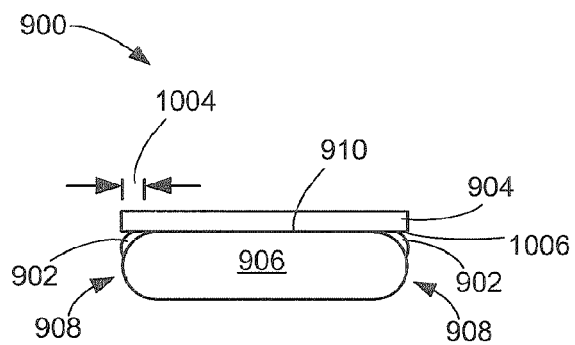
FIG. 11 is a cross-sectional view of the wafer strength reinforcement system in a taping phase.

Referring now to FIG. 11, therein is shown a cross-sectional view of the wafer strength reinforcement system 900 in a taping phase. The tape 904 having the paste 902 adheres to and protects active circuitry (not shown) on the active surface 910 of the wafer 906. The tape 904 includes the contact surface 1006 whereon the tape 904 may adhere to the wafer 906 without contaminating or damaging the active surface 910 of the wafer 906 during application or removal. Applying the tape 904 having the paste 902 redistributes the paste 902 to conform to the region between the edge 908 on the active surface 910 of the wafer 906 and the extension 1004 of the tape 904. The tape 904 further provides high temperature resistance for curing and structural integrity for further processing.

Figure 12:
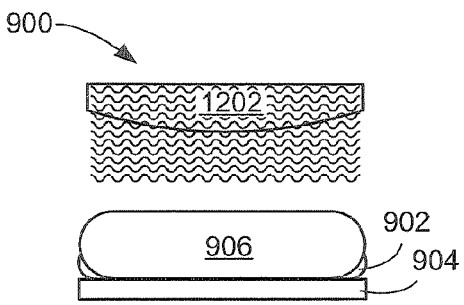
FIG. 12 is a cross-sectional view of the wafer strength reinforcement system in a curing phase.

Referring now to FIG. 12, therein is shown a cross-sectional view of the wafer strength reinforcement system 900 in a curing phase. A curing apparatus 1202 applies a process, such as heat, UV or laser irradiation, to the wafer strength reinforcement system 900 attached to the wafer 906. The curing process cures and hardens the paste 902. The paste 902 provides a hardness to withstand a thinning process, such as grinding, and a softness to cushion the wafer 906 during the thinning process. Further, the paste 902 provides an adhesive force equal to or greater than a thinning force exerted on the wafer 906 during the thinning process. The paste 902 may be removed with the tape 904 or remain on the wafer 906 after the tape 904 is removed.

Figure 13:
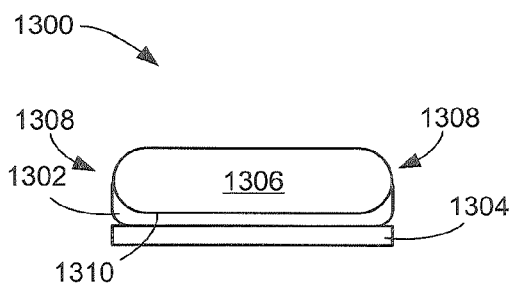
FIG. 13 is a cross-sectional view of a wafer strength reinforcement system in yet another alternative embodiment of the present invention.

Referring now to FIG. 13, therein is shown a cross-sectional view of a wafer strength reinforcement system 1300 in yet another alternative embodiment of the present invention. The wafer strength reinforcement system 1300 provides a wafer level coating before taping process and includes a paste 1302, such as a liquid paste, and a tape 1304, such as a protective tape. The paste 1302 and the tape 1304 are applied to a wafer 1306. The paste 1302 conforms to an edge 1308 of the wafer 1306 to support and protect the edge 1308 of the wafer 1306. The tape 1304 protects an active surface 1310 of the wafer 1306 during further processing. The paste 1302 and the tape 1304 of the wafer strength reinforcement system 1300 provide protection for both the edge 1308 as well as the active surface 1310.

Figure 14:
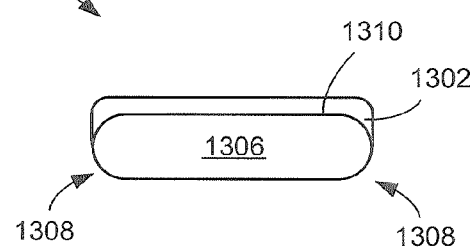
FIG. 14 is a cross-sectional view of the wafer strength reinforcement system in a coating phase.

Referring now to FIG. 14, therein is shown a cross-sectional view of the wafer strength reinforcement system 1300 in a coating phase. The paste 1302 is dispensed, such as spin coating, on the active surface 1310 of the wafer 1306. The paste 1302 conforms to the edge 1308 on the active surface 1310 of the wafer 1306 and coats a planar surface of the active surface 1310. Further, the paste 1302 extends across the edge 1308 and the active surface 1310 of the wafer 1306 forming a partially planar coating. A dispensing process may dispense a predetermined quantity of the paste 1302 providing the planar coating of the active surface 1310 and conforming to a narrow region between the edge 1308 of the wafer 1306 and the tape 1304 of FIG. 13 (not shown).

Figure 15:
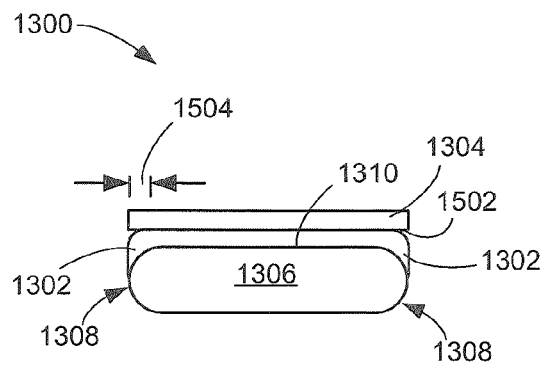
FIG. 15 is a cross-sectional view of the wafer strength reinforcement system in a taping phase.

Referring now to FIG. 15, therein is shown a cross-sectional view of the wafer strength reinforcement system 1300 in a taping phase. The tape 1304 adheres to the paste 1302 and provides additional protection to active circuitry (not shown) on the active surface 1310 of the wafer 1306. The tape 1304 includes a contact surface 1 502 whereon the tape 1304 may adhere to the paste 1302. An extension 1 504 of the tape 1304 provides a region beyond a planar region of the active surface 1310 for the quantity of the paste 1302 conforming to the narrow region at the edge 1308 of the wafer 1306. Applying the tape 1304 redistributes the paste 1302 to conform to the region between the edge 1308 and the extension 1504. The tape 1304 further provides high temperature resistance for curing and structural integrity for further processing.

Referring now to FIG. 1 6, therein is shown a cross-sectional view of the wafer strength reinforcement system 1300 in a curing phase. A curing apparatus 1602 applies a process, such as heat, UV or laser irradiation, to the wafer strength reinforcement system 1300 attached to the wafer 1306. The curing process cures and hardens the paste 1302. The paste 1302 process provides a hardness to withstand a thinning process, such as grinding, and a softness to cushion the wafer 1306 during the thinning process. Further, the paste 1302 provides an adhesive force equal to or greater than a thinning force exerted on the wafer 1306 during the thinning process. The paste 1302 may be removed with the tape 1304 or remain on the wafer 1306 after the tape 1304 is removed.

Figure 17:
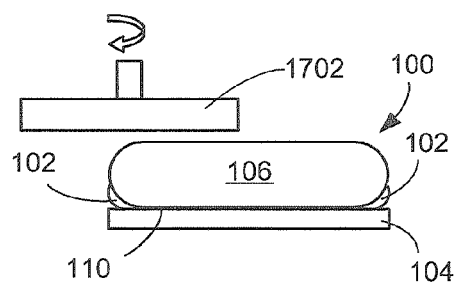
FIG. 17 is a cross-sectional view of the wafer strength reinforcement system in a thinning phase.

Referring now to FIG. 17, therein is shown a cross-sectional view of the wafer strength reinforcement system 100 in a thinning phase. The wafer strength reinforcement system 100 provides support, such as planar integrity, during a thinning process. A thinning apparatus 1702 removes a portion of material from the wafer 106. The thinning apparatus 1702 may be applied to the wafer 106 repeatedly to provide a predetermined thickness of the wafer 106. The paste 102 and the tape 104 provide support throughout thinning process steps.

Figure 18:
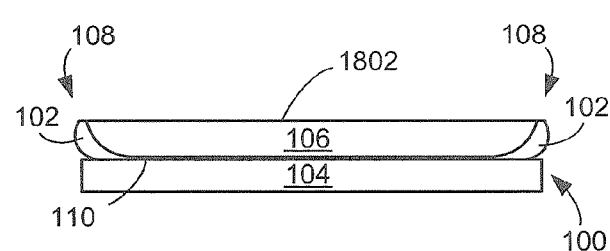
FIG. 18 is a cross-sectional view of the wafer strength reinforcement system in a stress-relieving phase.

Referring now to FIG. 18, therein is shown a cross-sectional view of the wafer strength reinforcement system 100 in a stress relieving-phase. The paste 102 and tape provide cushioning, such as softness or elasticity, to the edge 108 of the wafer 106 for the thinning process. A non-active surface 1802 of the wafer 106 is thinned to approximately 20 microns to 25 microns or approximately 0.8 mils to 1.0 mils. The edge 108 of the wafer 106 has a thickness significantly less than the wafer 106. The paste 102 provides support and cushioning for the edge 108 to resist damage, such as chipping or cracking.

Figure 19:
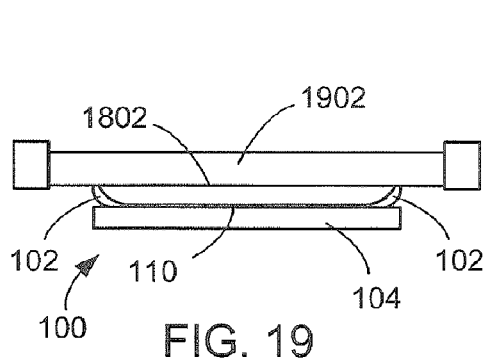
FIG. 19 is a cross-sectional view of the wafer strength reinforcement system in a mounting phase.

Referring now to FIG. 19, therein is shown a cross-sectional view of the wafer strength reinforcement system 100 in a mounting phase. The non-active surface 1802 of the wafer 106 is mounted to a dicing tape 1902. The active surface 110 of the wafer 106 remains attached to the wafer strength reinforcement system 100. The dicing tape 1902 is attached to the wafer 106 having the wafer strength reinforcement system 100 to provide support to the wafer 106 for subsequent processing, such as singulation.

Figure 20:
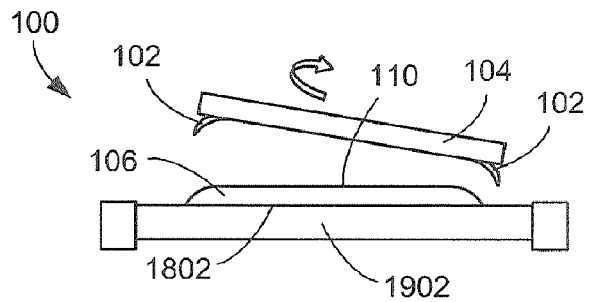
FIG. 20 is a cross-sectional view of the wafer strength reinforcement system in a detaping phase.

Referring now to FIG. 20, therein is shown a cross-sectional view of the wafer strength reinforcement system 100 in a detaping phase. The dicing tape 1902 provides structural integrity to the wafer 106 such that the wafer strength reinforcement system 100 may be removed. The paste 102 and the tape 104 of the wafer strength reinforcement system 100 may be removed together from the active surface 110 of the wafer 106. The wafer 106 remains attached to the dicing tape 1902 for subsequent processing.

Figure 21:
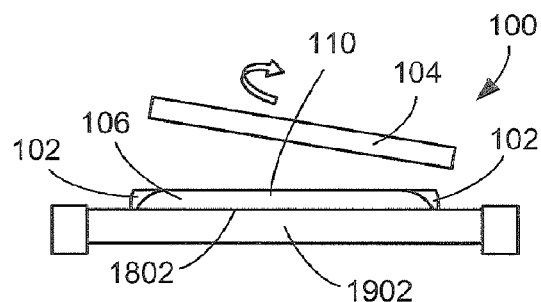
FIG. 21 is a cross-sectional view of the wafer strength reinforcement system in an alternative detaping phase.

Referring now to FIG. 21, therein is shown a cross-sectional view of the wafer strength reinforcement system 100 in an alternative detaping phase. The dicing tape 1902 provides structural integrity to the wafer 106 such that the wafer strength reinforcement system 100 may be removed. The tape 104 of the wafer strength reinforcement system 100 may be removed from the active surface 110 of the wafer 106. The paste 102 remains attached to the wafer during the alternative detaping phase.

Figure 22:
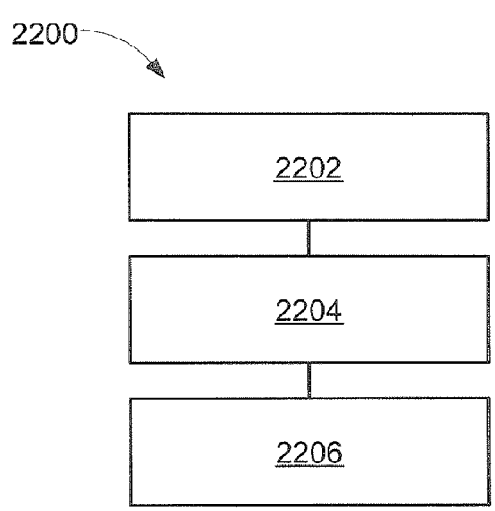
FIG. 22 is a flow chart of a system for a wafer strength reinforcement system in an embodiment of the present invention.

Referring now to FIG. 22 is a flow chart of a system 2200 for a wafer strength reinforcement system in an embodiment of the present invention. The system 2200 includes providing a wafer in a block 2202; providing a tape for supporting the wafer in a block 2204; and positioning a wafer edge support material for location between the tape and the wafer on the wafer in a block 2206.

In greater detail, a method to fabricate the wafer strength reinforcement system 100, in an embodiment of the present invention, is performed as follows:
(1) 1. Providing the wafer 106 having active circuitry. (FIG. 1)
(2) 2. Forming the tape 104 having the contact surface 202. (FIG. 2)
(3) 3. Applying the paste 102, conforming to the edge 108 of the wafer 106, and the tape 104 on the wafer 106. (FIG. 3)

It has been discovered that the present invention thus has numerous aspects.

An aspect is that the present invention allows the wafer to be thinned without damage to the edge of the wafer. The edge is significantly thinner than the wafer throughout the thinning process. The present invention provides resistance to chipping and cracking of the particularly susceptible edge of the wafer.

It has been discovered that the disclosed structure provides reinforcement in a narrow gap. The edge of the wafer may not be planar to the active surface resulting in a narrow gap between the edge and a planar support, such as a tape. The disclosed structure includes a paste in a liquid state that conforms to the narrow gap.

It has also been discovered that the disclosed structure provides "hardness" to withstand the forces of a thinning process, such as a grinding force. The paste is cured to provide a hard surface to maintain firm support to the wafer and tape during thinning processes. This structural integrity provides support to the wafer particularly at the edge.

Yet another discovery of the disclosed structure is that the disclosed structure provides "softness" to cushion the wafer during the forces of a thinning process, such as a grinding force. The cured paste maintains a soft or elastic property providing a cushion effect during thinning processes, providing protection to the wafer particularly at the edge.

Yet another discovery of the disclosed structure provides for a level of adhesive strength after curing to withstand forces of a thinning process, such as a grinding force. The paste and the tape maintain adhesion after curing equal to or greater than the thinning forces on the wafer. The adhesion maintains the position of the paste and tape to protect the wafer particularly at the edge.

Yet another discovery of the disclosed structure provides for high temperature resistance. The paste and tape provide resistance to curing processes, including high temperatures. The hardness, softness and adhesion properties are maintained during and after curing, including high temperatures.

Yet another discovery of the disclosed structure provides for a paste and tape that do not contaminate an active surface of the wafer having active circuitry. The paste and tape adhere to the active surface of the wafer without contaminating or damaging the active circuitry during application or removal.

These and other valuable aspects of the present invention consequently further the state of the technology to at least the next level.

Thus, it has been discovered that the wafer strength reinforcement system method and apparatus of the present invention furnish important and heretofore unknown and unavailable solutions, capabilities, and functional aspects. The resulting processes and configurations are straightforward, cost-effective, uncomplicated, highly versatile and effective, can be implemented by adapting known technologies, and are thus readily suited for efficient and economical manufacturing.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method for fabricating a wafer strength reinforcement system comprising:
   providing a wafer having a rounded edge;
   providing a tape, having a planar surface extending beyond the rounded edge of the wafer, for supporting the wafer; and
   positioning a wafer edge support material between the planar surface of the tape and the rounded edge of the wafer through capillary action for supporting the rounded edge of the wafer.

2. The method as claimed in claim 1 wherein positioning the wafer edge support material further comprises:
   mounting the tape on an active surface of the wafer; and
   inserting the wafer edge support material at least between an edge of the wafer and the tape.

3. The method as claimed in claim 1 wherein positioning the wafer edge support material includes conforming the wafer edge support material to a narrow region between the rounded edge of the wafer and the planar surface of the tape.

4. The method as claimed in claim 1 wherein positioning the wafer edge support material further comprises:
   positioning the wafer edge support material on the tape; and
   mounting the tape having the wafer edge support material on an active surface of the wafer with the wafer edge support material at least between the edge of the wafer and the tape.

5. The method as claimed in claim 1 wherein positioning the wafer edge support material further comprises hardening the wafer edge support material at least between the edge of the wafer and the tape.

6. The method as claimed in claim 1 wherein positioning the wafer edge support material includes positioning the wafer edge support material in a liquid state.

7. The method as claimed in claim 1 further comprising:
   backgrinding the wafer with the wafer edge support material hardened at least between the edge of the wafer and the tape.

8. The method as claimed in claim 1 further comprising:
   backgrinding the wafer and the wafer edge support material hardened at least between the edge of the wafer and the tape; and
   mounting a dicing tape over the wafer, the wafer edge support material, and the tape.

9. The method as claimed in claim 1 further comprising:
   backgrinding the wafer with the wafer edge support material hardened at least between the edge of the wafer and the tape;
   mounting a dicing tape over the wafer, the wafer edge support material, and the tape; and
   removing at least the tape from the wafer mounted on the dicing tape.

10. The method as claimed in claim 1 further comprising:
    backgrinding the wafer with the wafer edge support material hardened at least between the edge of the wafer and the tape;
    mounting a dicing tape over the wafer, the wafer edge support material, and the tape;
    removing the tape from the wafer mounted on the dicing tape; and
    dicing the wafer and the wafer edge support material.

11. A method for fabricating a wafer strength reinforcement system comprising:
    providing a semiconductor wafer having a rounded edge;
    providing a backgrinding tape, having a planar surface extending beyond the rounded edge of the wafer, for supporting the semiconductor wafer; and
    applying a paste between the planar surface of the backgrinding tape and the rounded edge of the semiconductor wafer through capillary action for supporting the rounded edge of the wafer.

12. The method as claimed in claim 11 wherein applying the paste further comprises:
    mounting the backgrinding tape on an active surface of the semiconductor wafer; and
    dispensing the paste at least between an edge of the semiconductor wafer and the backgrinding tape.

13. The method as claimed in claim 11 wherein applying the paste includes conforming the paste to a narrow region between the rounded edge of the wafer and the planar surface of the backgrinding tape.

14. The method as claimed in claim 11 wherein applying the paste further comprises:
    applying the paste on the backgrinding tape; and
    mounting the backgrinding tape having the paste on an active surface of the semiconductor wafer with the paste at least between the edge of the semiconductor wafer and the backgrinding tape.

15. The method as claimed in claim 11 wherein applying the paste further comprises hardening the paste at least between the edge of the semiconductor wafer and the backgrinding tape.

16. The method as claimed in claim 11 wherein applying the paste includes applying the paste in a liquid state.

17. The method as claimed in claim 11 further comprising:
    backgrinding the semiconductor wafer with the paste hardened at least between the edge of the semiconductor wafer and the backgrinding tape.

18. The method as claimed in claim 11 further comprising:
    backgrinding the semiconductor wafer and the paste hardened at least between the edge of the semiconductor wafer and the backgrinding tape; and
    mounting a dicing tape over the semiconductor wafer, the paste, and the backgrinding tape.

19. The method as claimed in claim 11 further comprising:
    backgrinding the semiconductor wafer with the paste hardened at least between the edge of the semiconductor wafer and the backgrinding tape;
    mounting a dicing tape over the semiconductor wafer, the paste, and the backgrinding tape; and
    removing at least the backgrinding tape from the semiconductor wafer mounted on the dicing tape.

20. The method as claimed in claim 11 further comprising:
    backgrinding the semiconductor wafer with the paste hardened at least between the edge of the semiconductor wafer and the backgrinding tape;
    mounting a dicing tape over the semiconductor wafer, the paste, and the backgrinding tape;
    removing the backgrinding tape from the semiconductor wafer mounted on the dicing tape; and
    dicing the semiconductor wafer and the paste.

* * * * *

UNITED STATES PATENT AND TRADEMARK OFFICE
CERTIFICATE OF CORRECTION

| | | |
|---|---|---|
| PATENT NO. | : 8,124,455 B2 | |
| APPLICATION NO. | : 11/306098 | |
| DATED | : February 28, 2012 | |
| INVENTOR(S) | : Kuan et al. | |

Figure 16:
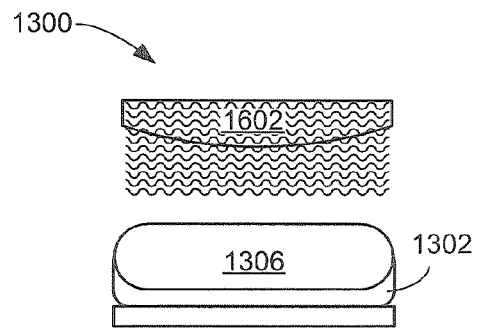
FIG. 16 is a cross-sectional view of the wafer strength reinforcement system in a curing phase.

It is certified that error appears in the above-identified patent and that said Letters Patent is hereby corrected as shown below:

Column 6:

lines 33-34, delete "contact surface 1 502 whereon the tape 1304 may adhere to the paste 1302. An extension 1 504 of the tape" and insert therefor --contact surface 1502 whereon the tape 1304 may adhere to the paste 1302. An extension 1504 of the tape-- line 42, delete "Referring now to FIG. 1 6, therein" and insert therefor --Referring now to FIG. 16, therein--

Signed and Sealed this
Eleventh Day of September, 2012

David J. Kappos
*Director of the United States Patent and Trademark Office*